(12) United States Patent
Matsuoka

(10) Patent No.: US 11,496,104 B2
(45) Date of Patent: Nov. 8, 2022

(54) DIFFERENTIAL AMPLIFIER

(71) Applicant: Asahi Kasei Microdevices Corporation, Tokyo (JP)

(72) Inventor: Daisuke Matsuoka, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 51 days.

(21) Appl. No.: 17/159,163

(22) Filed: Jan. 27, 2021

(65) Prior Publication Data

US 2021/0242845 A1 Aug. 5, 2021

(30) Foreign Application Priority Data

Jan. 30, 2020 (JP) .............................. JP2020-013986

(51) Int. Cl.
*H03F 3/45* (2006.01)

(52) U.S. Cl.
CPC ... *H03F 3/45179* (2013.01); *H03F 2200/129* (2013.01); *H03F 2203/45526* (2013.01)

(58) Field of Classification Search
CPC ........... H03F 3/45179; H03F 2200/129; H03F 2203/45526; H03F 2203/45008; H03F 1/3211; H03F 3/45183; H03F 3/45636; H03F 3/45704; H03F 3/45475

USPC .................................................. 330/252–261
See application file for complete search history.

(56) References Cited

U.S. PATENT DOCUMENTS

| | | |
|---|---|---|
| 2002/0153943 A1 | 10/2002 | Uchiki et al. |
| 2011/0057727 A1 | 3/2011 | Cranford, Jr. et al. |

FOREIGN PATENT DOCUMENTS

| | | |
|---|---|---|
| JP | 2011205320 | 10/2011 |
| JP | 2013038603 | 2/2013 |

*Primary Examiner* — Samuel S Outten
*Assistant Examiner* — Khiem D Nguyen
(74) *Attorney, Agent, or Firm* — JCIPRNET

(57) ABSTRACT

A differential amplifier is provided, in which generation of unnecessary harmonic distortion in the differential output signal is suppressed. A common mode feedback circuit increases or decreases operating points of an inverting output terminal and a non-inverting output terminal such that an intermediate voltage of voltages respectively provided to an inverting input terminal and a non-inverting input terminal is consistent with to a reference voltage. Variations in voltage at the inverting input terminal and the non-inverting input terminal are suppressed, variations in electrical properties of elements connected to the input terminals are suppressed. Therefore, it is possible to suppress generation of harmonic distortion in the output signals from the inverting output terminal and the non-inverting output terminal.

4 Claims, 10 Drawing Sheets

DIFFERENTIAL AMPLIFIER

CROSS REFERENCE TO RELATED APPLICATIONS

This application claims the priority benefit of Japanese Patent Application No. 2020-013986, filed on Jan. 30, 2020. The entirety of the above-mentioned patent application is hereby incorporated by reference herein and made a part of this specification.

BACKGROUND

Technical Field

The present disclosure relates to a fully differential input-type differential amplifier.

Description of Related Art

In a fully differential input-type differential amplifier in the related art, variations in intermediate voltage of differential output signals due to mismatching of element devices or the like are suppressed through control performed such that the intermediate voltage of the differential output signals becomes a constant voltage using a common-mode feedback (CMFB) circuit (see Patent Document 1 (Japanese Patent Application Laid-Open No. 2013-38603), for example).

FIG. 9 is a schematic view illustrating an example of a fully differential input-type differential amplifier (hereinafter, also referred to as a fully differential operational amplifier) 101 in the related art.

A differential of voltages provided to two input terminals INP and INN is amplified by the fully differential operational amplifier 101 and is generated as a differential of voltages of two output terminals OUTP and OUTN. Also, a reference voltage VCOM that is a constant voltage is provided to an input terminal COM, and the reference voltage VCOM is provided to a common mode feedback circuit CMFB-a configured inside the fully differential operational amplifier 101. The common mode feedback circuit CMFB-a performs control such that the center of the differential of voltages of the output terminals OUTP and OUTN becomes substantially equal to the reference voltage VCOM provided to the input terminal COM.

Since the fully differential operational amplifier 101 in the related art includes the common mode feedback circuit CMFB-a that performs control such that the intermediate voltage of the differential output signals becomes the reference voltage VCOM as described above, variations that depend on the differential output signal may occur in the voltages of the input terminals INP and INN of the fully differential operational amplifier 101. Therefore, electrical properties of elements connected to the input terminals INP and INN of the fully differential operational amplifier 101 may vary depending on input signals provided to the input terminals INP and INN, and as a result, harmonic distortion may occur in the differential output signal.

The harmonic distortion will be described using a circuit illustrated in FIG. 10. FIG. 10 is a circuit configuration example using the fully differential operational amplifier 101 in the related art and is a circuit configuration example of a fully differential inverting circuit 102 provided with a mute function. The fully differential inverting circuit 102 is produced using the fully differential operational amplifier 101 in the related art. Note that FIG. 10 schematically illustrates an example of a differential input signal and a differential output signal of the fully differential operational amplifier 101.

An input signal +VIN provided to the fully differential inverting circuit 102 is provided to the input terminal INN via an input resistor rin1 and a switch sw1. The input signal +VIN is provided to the differential input terminal INP via an input resistor rin2 and a switch sw2.

A feedback resistor rfb1 and a feedback capacitance cfb1 are connected in parallel between the input terminal INN and the output terminal OUTP. A feedback resistor rfb2 and a feedback capacitance cfb2 are connected in parallel between the input terminal INP and the output terminal OUTN. As illustrated in FIG. 10, a resistance value of the input resistor rin1 is defined as Rin1, a resistance value of the input resistor rin2 is defined as Rin2, a resistance value of the feedback resistor rfb1 is defined as Rfb1, a resistance value of the feedback resistor rfb2 is defined as Rfb2, a capacitance value of the feedback capacitance cfb1 is defined as Cfb1, and a capacitance value of the feedback capacitance cfb2 is defined as Cfb2. Also, a resistance value when the switch sw1 and the switch sw2 are in the ON state (conductive state) (hereinafter, also referred to as an ON resistance) is the same and is defined as RSW.

In the fully differential inverting circuit 102 illustrated in FIG. 10, relationships of an input signal ±VIN that is a sine wave signal provided to the fully differential inverting circuit 102, output signals VOUTP and VOUTN of the fully differential operational amplifier 101, and VAP and VAN that are input signals of the fully differential operational amplifier 101 are represented by Equation (1) below.

$$\text{VOUTP}=\text{Zfb1}/(\text{Rin1}+\text{RSW})\times\text{VIN}+(\text{Zfb1}/(\text{Rin1}+\text{RSW})+1)\times\text{VAN}$$

$$\text{VOUTN}=-\text{Zfb2}/(\text{Rin2}+\text{RSW})\times\text{VIN}+(\text{Zfb2}/(\text{Rin2}+\text{RSW})+1)\times\text{VAP}$$

$$\text{Zfb1}=1/(1/\text{Rfb1}+j\omega\text{Cfb1})$$

$$\text{Zfb2}=1/(1/\text{Rfb2}+j\omega\text{Cfb2})\ldots \quad (1)$$

Here, the fully differential inverting circuit 102 when a gain from a differential input to a differential output of the fully differential operational amplifier 101 is sufficiently large and in a state in which it can be regarded that VAP=VAN=VA will be considered.

Equation (2) below is obtained by assigning VAP=VAN=VA to Equation (1) representing the output signals VOUTP and VOUTN.

$$\text{VOUTP}=\text{Zfb1}/(\text{Rin1}+\text{RSW})\times\text{VIN}+(\text{Zfb1}/(\text{Rin1}+\text{RSW})+1)\times\text{VA}$$

$$\text{VOUTN}=-\text{Zfb2}/(\text{Rin2}+\text{RSW})\times\text{VIN}+(\text{Zfb2}/(\text{Rin2}+\text{RSW})+1)\times\text{VA}\ldots \quad (2)$$

The first terms of Equation (2) representing the output signals VOUTP and VOUTN are products of Zfb1/(Rin1+RSW) and VIN and of −Zfb2/(Rin2+RSW) and VIN, respectively, and the output signals VOUTP and VOUTN are ideal output signals based on the input signal ±VIN in a case in which each of Zfb1, Zfb2, Rin1, Rin2, and RSW is a constant value with no signal dependency.

However, in a case in which the two switches sw1 and sw2 are configured of MOS transistors, the ON resistance RSW of the switches sw1 and sw2 changes due to variations in the voltage VA that is a voltage at a terminal on one side of each of the two switches sw1 and sw2. Therefore, variations in voltage of the ON resistance RSW may cause harmonic distortion. In other words, in order to suppress harmonic distortion generated in a differential output signal and obtain an ideal differential signal output based on the input signal ±VIN, it is necessary to suppress variations in voltage of the input signal VA (±VIN) to the fully differential operational amplifier 101 and to obtain a constant voltage.

However, no control is performed to obtain a constant input signal VA in the fully differential operational amplifier 101, and the common mode feedback circuit CMFB-a performs control to obtain a constant intermediate voltage of differential output signals.

FIG. 11 is a circuit diagram illustrating an example of the fully differential operational amplifier 101 in the related art.

In FIG. 11, a transistor M111 and a transistor M112 that are N-channel MOS transistors configure a differential pair, and gates of the transistors M111 and M112 are connected to the input terminals INP and INN of the fully differential operational amplifier 101, respectively. Also, a current of a current source I102 flows through a drain of a transistor M123 that is a P-channel MOS transistor diode-connected through gate-drain wiring and generates a reference voltage. The generated reference voltage is provided to gates of two transistors M121 and M122 that are P-channel MOS transistors, and a load current of the fully differential operational amplifier 101 is generated from each of drains of the transistor M121 and the transistor M122. Also, the drains of the transistors M111 and M121 are connected to each other, and the connecting point is connected to the output terminal OUTN. Similarly, the drains of the transistors M112 and M122 are connected to each other, and the connecting point is connected to the output terminal OUTP.

Also, two transistors M131 and M132 that are P-channel MOS transistors are a differential pair included in the common mode feedback circuit CMFB-a, and a gate of the transistor M131 is connected to one end of each of two resistors r101 and r102 having the same resistance values R1 and R2. Also, the other ends of the resistor r101 and r102 are connected to the output terminals OUTN and OUTP, respectively. A gate of the transistor M132 is connected to the input terminal COM. The reference voltage VCOM that is a constant voltage is provided to the input terminal COM.

The transistors M141 and M142 are N-channel MOS transistors diode-connected with gate-drain wiring, and a total current flowing through each of drains of the transistors M141 and M142 is equal to a current flowing from a current source I103. Also, a voltage generated through the diode-connection of the transistor M142 is provided to a gate of a transistor M143 to control a drain current of the transistor M143. Drain currents of a current source I101 and the transistor M143 are tail currents of the transistors M111 and M112 that are a differential pair of the fully differential operational amplifier 101, respectively.

Since the resistors r101 and r102 are set to have the same resistance values R1 and R2 in the fully differential operational amplifier 101 with the configuration illustrated in FIG. 11, the intermediate voltage of the differential output signals that is a difference between signals output from the output terminal OUTN and the output terminal OUTP is provided to the gate of the transistor M131 that is a differential pair of the common mode feedback circuit CMFB-a and is compared with the reference voltage VCOM provided to the gate of the transistor M132 that is the other one of the differential pair. The gate voltage of the transistor M143 is controlled, and the drain current of the transistor M143 is increased or decreased, by the current flowing into the drain of the transistor 142 being controlled based on the comparison result. Both the voltages generated from the output terminals OUTN and OUTP are controlled through the increase or the decrease in drain current of the transistor M143, and the intermediate voltage of the differential output signals becomes equal to the reference voltage COM.

In this manner, although the common mode feedback circuit CMFB-a included in the fully differential operational amplifier 101 illustrated in FIG. 11 performs control such that the intermediate voltage of the differential output signals become a constant voltage (reference voltage VCOM), no control is performed to obtain a constant input signal VA (=|±VIN|) that is an input voltage of the fully differential operational amplifier 101, in the fully differential inverting circuit 102 illustrated in FIG. 10.

Next, variations in voltage VA due to the fully differential operational amplifier 101 will be described.

As illustrated in FIG. 10, the fully differential operational amplifier 101 has the common mode feedback circuit CMFB-a, and Equation (3) below is satisfied.

$$(VOUTP+VOUTN)/2=VCOM \ldots \quad (3)$$

Here, if it is assumed that VCOM=0 for simplifying consideration, Equation (4) below is obtained from Equation (3).

$$(VOUTP+VOUTN)/2=0$$

$$VOUTP+VOUTN=0 \ldots \quad (4)$$

Also, if Equation (2) representing VOUTP and VOUTN is substituted into Equation (4) and Equation (4) is then reorganized, Equation (5) below is obtained.

$$(Zfb1/(Rin1+RSW)-Zfb2/(Rin2+RSW))\times VIN + \\ ((Zfb1/(Rin1+RSW)+1)+(Zfb2/(Rin2+RSW)+ \\ 1))\times VA=0 \ldots \quad (5)$$

If Equation (5) is reorganized, then VA is represented by Equation (6) below.

$$VA=-(Z1-Z2)/(Z1+Z2+2)\times VIN \ldots \quad (6)$$

$$Z1=Zfb1/(Rin1+RSW)$$

$$Z2=Zfb2/(Rin2+RSW)$$

$$Zfb1=1/(1/Rfb1+j\omega Cfb1)$$

$$Zfb2=1/(1/Rfb2+j\omega Cfb2)$$

It is possible to ascertain from Equation (6) that VA=0 when Z1=Z2 and VA is a constant voltage with no term depending on |±VIN|.

Moreover, Z1=Z2 is satisfied in a case in which the resistances and the capacitances configuring Z1 and Z2 are Rin1=Rin2, Rfb1=Rfb2, and Cfb1=Cfb2. However, since the resistances and the capacitances typically have errors of about 1% in actual manufacturing, it is difficult to achieve Rin1=Rin2, Rfb1=Rfb2, and Cfb1=Cfb2, and VA may include variations in voltage depending on VIN represented by Equation (6). Therefore, the ON resistance RSW of the switches sw1 and sw2 may also vary in response to the variations in voltage VA, and this may generate unnecessary harmonic distortion in the differential output signals.

SUMMARY

Thus, the disclosure provides a differential amplifier capable of suppressing generation of unnecessary harmonic distortion in differential output signals.

According to an embodiment of the disclosure, there is provided a differential amplifier including: an inverting input terminal; a non-inverting input terminal; an inverting output terminal; a non-inverting output terminal; an input differential pair that determines operating points of the inverting output terminal and the non-inverting output terminal; a common mode detection circuit, to which a reference signal is provided, which generates a signal based on a differential between the reference voltage and an intermediate voltage of a voltage provided to the inverting input terminal and a voltage provided to the non-inverting input terminal; a first current generation circuit and a second current generation circuit, to which an output signal of the common mode detection circuit is provided, which generate a current in accordance with the output signal; a first transistor having a control terminal connected to an output terminal of the first current generation circuit; a second transistor having a control terminal connected to an output terminal of the second current generation circuit; a third current source having one end connected to a node between one end of the first transistor and the non-inverting output terminal; a fourth current source with one end connected to a node between one end of the second transistor and the inverting output terminal; a first circuit connected between the inverting input terminal and the non-inverting output terminal; and a second circuit connected between the non-inverting input terminal and the inverting output terminal.

According to an aspect of the disclosure, it is possible to further reduce distortion included in differential output signals.

DESCRIPTION OF THE EMBODIMENTS

Next, embodiments of the disclosure will be described with reference to the drawings. In the following description of the drawings, the same or similar reference signs will be applied to the same or similar components. However, the drawings provide schematic illustration. Also, the embodiments described below are for exemplifying apparatuses and methods for specifically implementing technical ideas of the disclosure, and the technical ideas of the disclosure are not intended to limit disposition and the like of components to the following ones. Various modifications can be added to the technical ideas of the disclosure within the technical scope defined by the claims.

FIRST EMBODIMENT

<Configuration>

Figure 1:
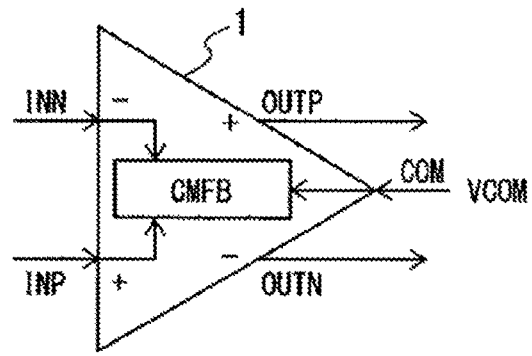
FIG. 1 a schematic view illustrating an example of a fully differential operational amplifier (fully differential input-type differential amplifier) according to an embodiment of the disclosure.

FIG. 1 is a schematic view illustrating an example of a differential amplifier 1 according to a first embodiment of the disclosure.

The differential amplifier 1 is a fully differential-type differential amplifier (hereinafter, also referred to as a fully differential operational amplifier), and a difference of voltage signals provided to two input terminals INP (non-inverting input terminal) and INN (inverting input terminal) is amplified by the fully differential operational amplifier 1 and is generated as a difference of voltage signals of two output terminals OUTP (non-inverting output terminal) and OUTN (inverting output terminal). Also, a reference voltage VCOM that is a constant voltage is provided to an input terminal COM, and the input reference voltage VCOM is provided to a common mode feedback circuit (common mode detection circuit) CMFB configured inside the fully differential operational amplifier 1. The common mode feedback circuit CMFB performs control such that the center of a difference between the voltage signals provided to the differential input terminals INP and INN is substantially equal to the reference voltage VCOM provided to the input terminal COM.

Circuit Configuration Example Using Fully Differential Operational Amplifier 1

Figure 2:
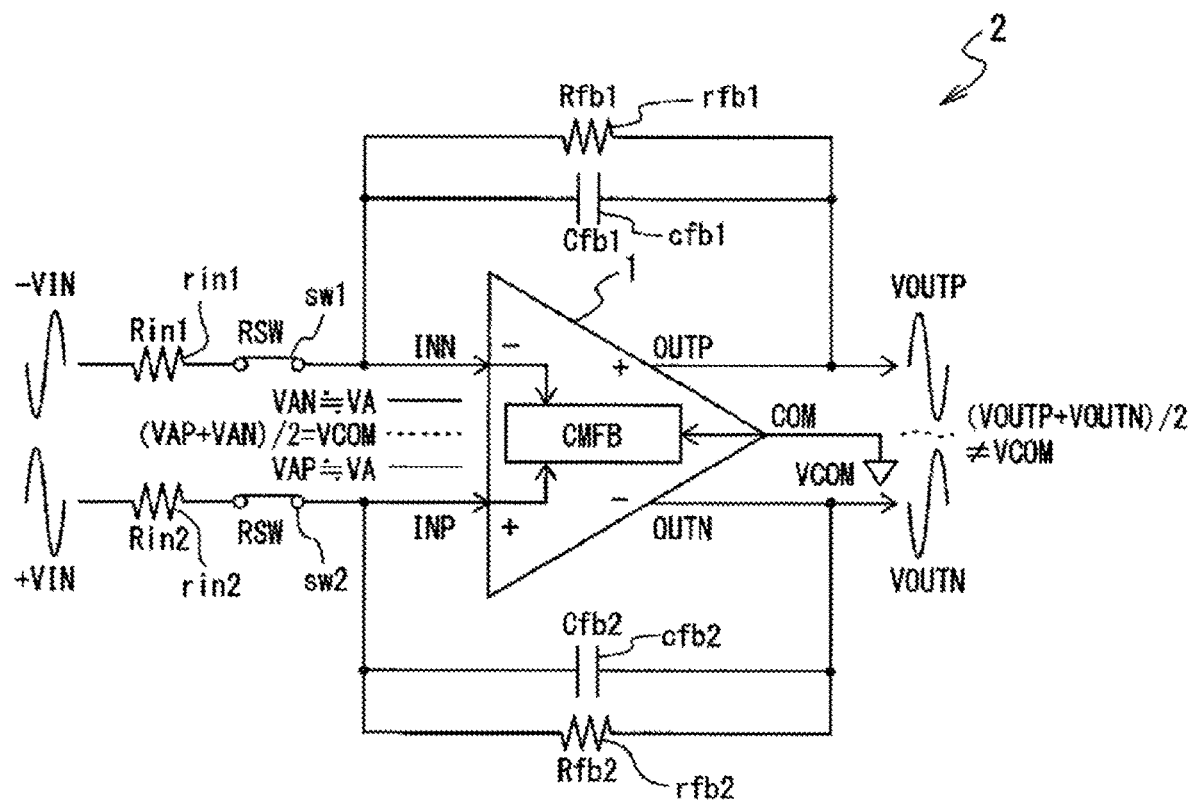
FIG. 2 is a circuit diagram illustrating an example of a fully differential inverting circuit provided with a mute function using a fully differential operational amplifier according to an embodiment of the disclosure.

FIG. 2 illustrates a configuration of a fully differential inverting circuit 2 provided with a mute function as a circuit configuration example using the fully differential operational amplifier 1. Also, FIG. 2 schematically illustrates waveforms of input signals +VIN and −VIN to the fully differential inverting circuit 2 and the output signals VOUTP and VOUTN from the fully differential inverting circuit 2 generated through utilization of the fully differential operational amplifier 1.

The input signal −VIN that is one of amplification targets is provided to the input terminal INN via an input resistor rin1 and a switch sw1. The input signal +VIN that is the other amplification target is provided to the input terminal INP via an input resistor rin2 and a switch sw2.

A feedback resistor rfb1 and a feedback capacitance cfb1 are connected in parallel between the input terminal INN and the output terminal OUTP. A feedback resistor rfb2 and a feedback capacitance cfb2 are connected in parallel between the input terminal INP and the output terminal OUTN. In this manner, the output signals VOUTP and VOUTN of the fully differential inverting circuit 2 are fed back to the input terminals INN and INP via the feedback resistor rfb1 and the feedback capacitance cfb1 and via the feedback resistor rfb2 and the feedback capacitance cfb2, respectively, and the intermediate voltage of the differential input signals is thus controlled and becomes equal to the reference voltage VCOM provided to the input terminal COM.

Note that in FIG. 2, Rin1 and Rin2 represent resistance values of the input resistor rin1 and the input resistor rin2, respectively, Rfb1 and Rfb2 represent resistance values of the feedback resistors rfb1 and rfb2, respectively, and Cfb1 and Cfb2 represent capacitance values of the feedback capacitors cfb1 and cfb2, respectively. Also, RSW represents an ON resistance, and the ON resistances of the switches sw1 and sw2 are the same value. Also, the switches sw1 and sw2 are controlled by a control device, which is not illustrated. The feedback resistor rfb1 and the feedback capacitor cfb1 correspond to the first circuit, and the feedback resistor rfb2 and the feedback capacitor cfb2 correspond to the second circuit.

A relationship of the input signal ±VIN that is a sine wave signal provided to the fully differential inverting circuit 2, output signals VOUTP and VOUTN, and VAP and VAN that are input signals of the fully differential operational amplifier 1 in the fully differential inverting circuit 2 illustrated in FIG. 2 can be represented by Equation (1) similarly to the related art described above.

Also, in a case in which a gain from a differential provided to a differential output of the fully differential operational amplifier 1 is sufficiently large, and a state in which it can be regarded that VAP=VAN=VA has been achieved, the output signals VOUTP and VOUTN can be represented by Equation (2) similarly to the related art described above.

Therefore, the output signals VOUTP and VOUTN are expected to be ideal output signals based on the input signal ±VIN in a case in which each of Zfb1, Zfb2, Rin1, Rin2, and RSW is a constant value with no signal dependency in the case of the fully differential inverting circuit 2 similarly to the example in the related art as described above. However, in a case in which the switches sw1 and sw2 are configured of MOS transistors, the resistance value of the ON resistance RSW of the switches sw1 and sw2 may change in response to variations in voltage VA that is a voltage of the switches sw1 and sw2 on the side of the input terminals INN and INP, and the variations in voltage of the resistance value RSW may thus causes harmonic distortion.

Therefore, the common mode feedback circuit CMFB performs control to obtain a constant intermediate voltage of differential input signals in the fully differential operational amplifier 1.

Configuration Example of Fully Differential Operational Amplifier 1

Figure 3:
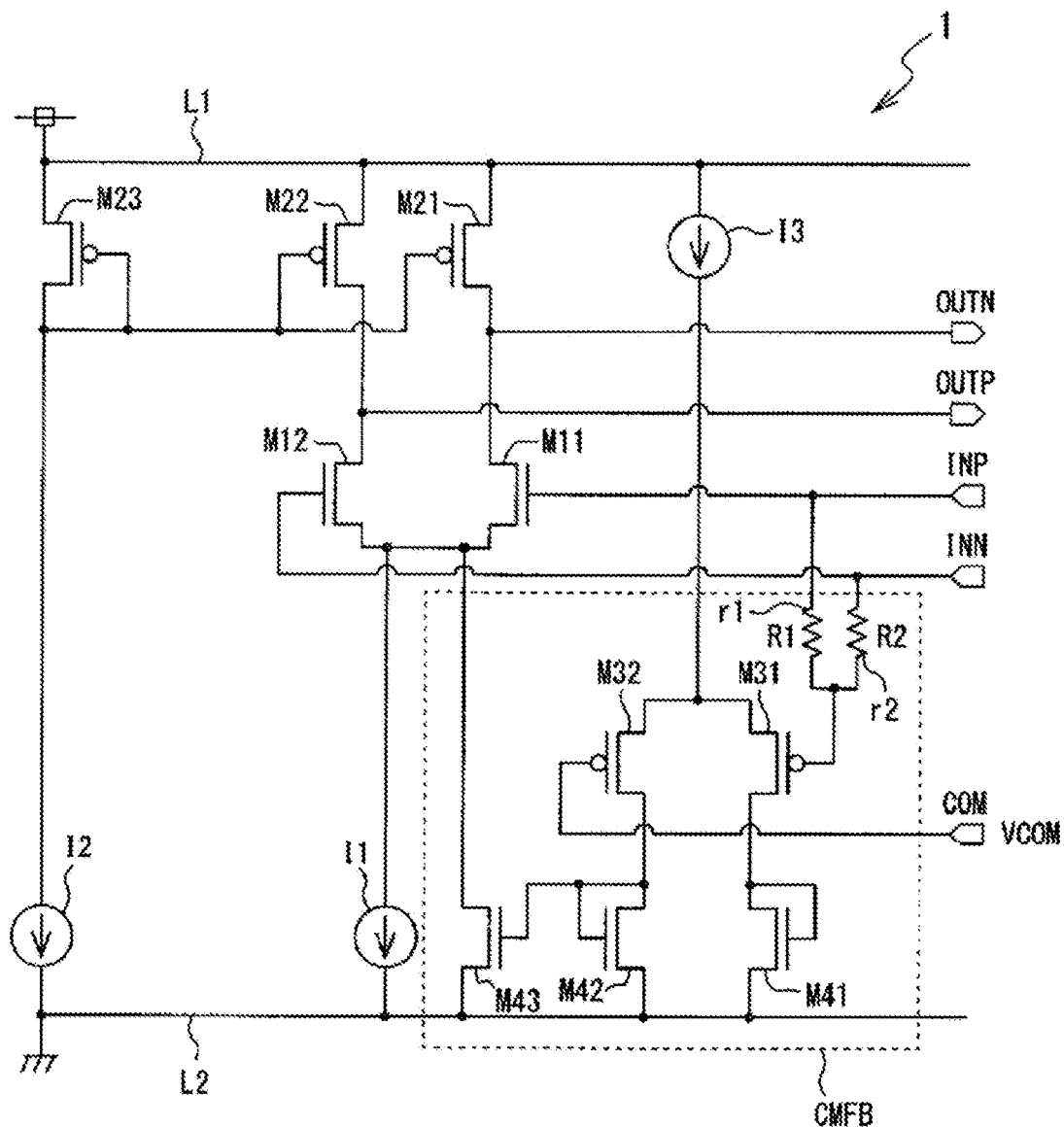
FIG. 3 is a circuit diagram illustrating an example of a fully differential operational amplifier according to a first embodiment of the disclosure.

FIG. 3 is a circuit diagram illustrating an example of the fully differential operational amplifier 1.
<Configuration example of fully differential operational amplifier 1>
FIG. 3 is a circuit diagram illustrating an example of the fully differential operational amplifier 1.

A transistor M11 and a transistor M12 that are N-channel MOS transistors configure a differential pair (input differential pair) that determines operating points of the output terminal OUTN and the output terminal OUTP and are connected between a power source line L1 and a power source line L2 (first power source). The power source line L2 is connected to a ground potential.

A gate of the transistor M11 is connected to one input terminal INP to which the differential signal of the fully differential operational amplifier 1 is provided, and a gate of the transistor M12 is connected to the other input terminal INN. A source of a transistor M23 that is a P-channel MOS transistor connected as a diode with gate-drain wiring is connected to the power source line L1 on a high potential side, and a constant current source I2 is connected between the drain of the transistor M23 and the power source line L2 on a low potential side.

The drain of the transistor M23 is connected to gates of transistors M21 and M22 that are load transistors configured of P-channel MOS transistors.

Sources of the transistors M21 and M22 are connected to the power source line L1, and drains are connected to drains of the transistors M11 and M12, respectively. Also, the drains of the transistors M11 and M21 are connected to the output terminal OUTN, and the drains of the transistors M12 and M22 are connected to the output terminal OUTP. Both the sources of the transistor M11 and the transistor M12 are connected to the power source line L2 via a transistor M43 that is an N-channel MOS transistor and are also connected to the power source line L2 via a constant current source I1 (first current source) connected in parallel to the transistor M43.

In other words, a current of the constant current source I2 flows through the drain of the transistor M23 and generates a reference voltage, the generated reference voltage is provided to the gates of the transistors M21 and M22, and a load current of the fully differential operational amplifier 1 is generated from the drains of the transistors M21 and M22.

Transistors M31 (third transistor) and M32 (fourth transistor) configured of P-channel transistors are a differential pair included in the common mode feedback circuit CMFB, sources of the transistors M31 and M32 are connected to each other, and a node at which the sources are connected is connected to the power source line L1 via a constant current source I3 (second current source). A gate of the transistor M31 is connected to the input terminal INP via a resistor r1 and is connected to the input terminal INN via a resistor r2. The resistance value R1 of the resistor r1 and the resistance value R2 of the resistor r2 are the same value. A gate of the transistor M32 is connected to the input terminal COM to which the reference voltage VCOM is provided.

A drain of the transistor M31 is connected to the power source line L2 via a transistor M41 (fifth transistor) configured of an N-channel MOS transistor. A drain of the transistor M32 is connected to the power source line L2 via a transistor M42 (sixth transistor) configured of an N-channel MOS transistor. The transistors M41 and M42 have gates and drains connected to each other, that is, are connected as dioses, and a total current flowing through the drains of the transistors M41 and M42 is equal to the current flowing from the constant current source I3. The gate and the drain of the transistor M42 are connected to a gate of the transistor M43.

In other words, the voltage generated through diode connection of the transistor M42 is provided to the gate of the transistor M43 and controls a drain current (bias current) of the transistor M43. The current flowing through the constant current source I1 and the drain current of the transistor M43 are tail currents of the transistors M12 and M11 that are a differential pair of the fully differential operational amplifier 1.

In the fully differential operational amplifier 1 illustrated in FIG. 3, the transistors M31 and M32, the transistors M41 to M43, and the resistors r1 and r2 configure the common mode feedback circuit CMFB. Also, the resistors r1 and r2 correspond to the intermediate voltage generation circuit.

Since the resistance values R1 and R2 of the resistors r1 and r2 are set to the same value in the fully differential operational amplifier 1 illustrated in FIG. 3, the intermediate voltage of signals differentially provided to the input terminals INP and INN is provided to the gate of the transistor M31 which is one of a differential pair. Also, since the reference voltage VCOM provided to the input terminal COM is provided to the gate of the transistor M32 that is the other one of the differential pair, the differential input signal is compared with the reference voltage VCOM.

The gate voltage of the transistor M43 is also controlled, and the drain current of the transistor M43 is increased or decreased, by the current flowing into the transistor M42 being controlled based on the comparison result. Through the increase or the decrease in drain current of the transistor M43, both differential voltages of signals generated from the output terminals OUTN and OUTP are controlled.

Here, control paths of the input terminals INP and INN from the output terminals OUTN and OUTP are not present in the circuit diagram of the fully differential operational amplifier 1 illustrated alone in FIG. 3, and apparently, this looks like as if control was not established by the common mode feedback circuit CMFB.

However, feedback elements as represented as rfb1, rfb2, cfb1, and cfb2 are actually present between the output terminal OUTP and the input terminal INN and between the output terminal OUTN and the input terminal INP in the fully differential inverting circuit 2 illustrated in FIG. 2. The controlled voltages of the output terminals OUTN and OUTP are transmitted to the input terminals INP and INN via the feedback elements. Therefore, the intermediate voltage of the differential inputs is controlled and becomes equal to the input voltage of the input terminal COM. The control is thus established by the common mode feedback circuit CMFB.

As described above, the common mode feedback circuit CMFB included in the fully differential operational amplifier 1 illustrated in FIG. 3 can suppress variations in voltage VA that is a differential input voltage of the fully differential operational amplifier 1 in the fully differential inverting circuit 2 illustrated in FIG. 2 as compared with the technique in the related art. Therefore, the ON resistance RSW of the switches sw1 and sw2 connected to the input terminals INN and INP of the differential signals of the fully differential operational amplifier 1 in FIG. 2 is controlled to be constant as compared with the related art. Therefore, it is possible to suppress unnecessary harmonic distortion generated in the differential output signals due to variations in the ON resistance RSW of the switches sw1 and sw2, as compared with the technique in the related art. Also, since the common mode feedback circuit CMFB performs control such that the intermediate voltage of the differential inputs is consistent with to the reference voltage VCOM provided to the input terminal COM, the intermediate voltage of the differential outputs is also controlled to be in consistent with the reference voltage VCOM, and it is thus possible to perform control such that the intermediate voltage of the differential outputs is consistent with the reference voltage VCOM and to suppress harmonic distortion.

Note that the case in which the differential voltages of the signals generated from the output terminals OUTN and OUTP are controlled through control of the drain current, that is, the bias current of the transistor M43 has been described here, the fully differential operational amplifier 1 may be configured using elements capable of controlling a vias voltage, and the differential voltages of the signals generated from the output terminals OUTN and OUTP may be controlled through control of the bias voltage.

Second Embodiment

Next, a second embodiment of the disclosure will be described.

Configuration Example of Fully Differential Operational Amplifier 1-1

Figure 4:
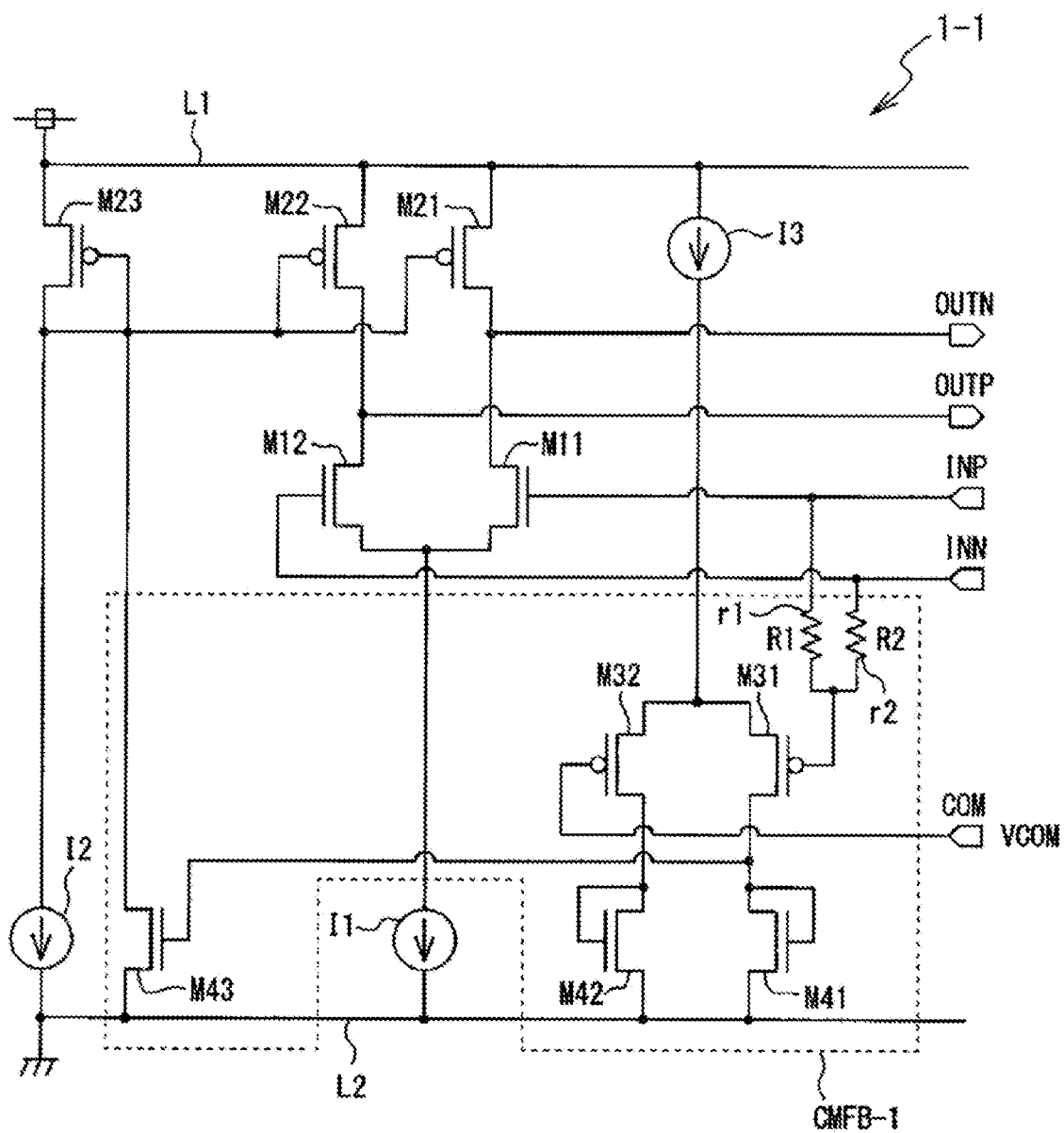
FIG. 4 is a circuit diagram illustrating an example of a fully differential operational amplifier according to a second embodiment of the disclosure.

FIG. 4 is a circuit diagram illustrating an example of a fully differential operational amplifier 1-1 according to the second embodiment. Note that the same reference signs will be applied to the same components as those in the fully differential operational amplifier 1 according to the first embodiment illustrated in FIG. 3 and detailed description thereof will be omitted.

The fully differential operational amplifier 1-1 according to the second embodiment has a common mode feedback circuit CMFB-1 with a different configuration.

In other words, the common mode feedback circuit CMFB illustrated in FIG. 3 is adapted such that the transistor M43 is connected between the transistors M11 and M12 and the power source line L2 while in FIG. 4, a transistor M43 is adapted such that a drain node of the transistor M43 is connected in parallel with a constant current source I1 between a power source line L2 and a drain and a gate of the transistor M23. Also, the drain of the transistor M43 is connected to gate nodes of transistors M21 and M22, and the source thereof is connected to the power source line L2. Moreover, the gate of the transistor M43 is connected to drains of transistors M31 and M41.

In the common mode feedback circuit CMFB-1 illustrated in FIG. 4, the transistor M43 controls drain currents of the transistors M21 and M22, and both voltages differentially generated from output terminals OUTN and OUTP are controlled, based on a result of comparison between a voltage provided to a gate of a transistor M31 and a voltage provided to a gate of a transistor M32, that is, a result of comparison between an intermediate voltage of differential input signals, which is a difference between voltages provided to input terminals INN and INP of the fully differential operational amplifier 1-1 and a reference voltage VCOM provided to an input terminal COM.

Since the voltages differentially generated from the output terminals OUTN and OUTP are controlled, and the intermediate voltage of the differential inputs is controlled to be equal to the reference voltage VCOM provided to the input terminal COM via feedback elements rfb1, rfb2. cfb1. and cfb2 as illustrated in FIG. 2 in this case as well, it is possible to obtain advantages equivalent to those of the fully differential operational amplifier 1 according to the first embodiment illustrated in FIG. 3. In other words, internal nodes that the common mode feedback circuit CMFB-1 controls from among internal nodes of the fully differential operational amplifier 1 can be selected from internal nodes capable of controlling both the voltages differentially generated from the output terminals OUTN and OUTP.

Third Embodiment

Next, a third embodiment of the disclosure will be described.

Configuration Example of Fully Differential Operational Amplifier 1-2

Figure 5:
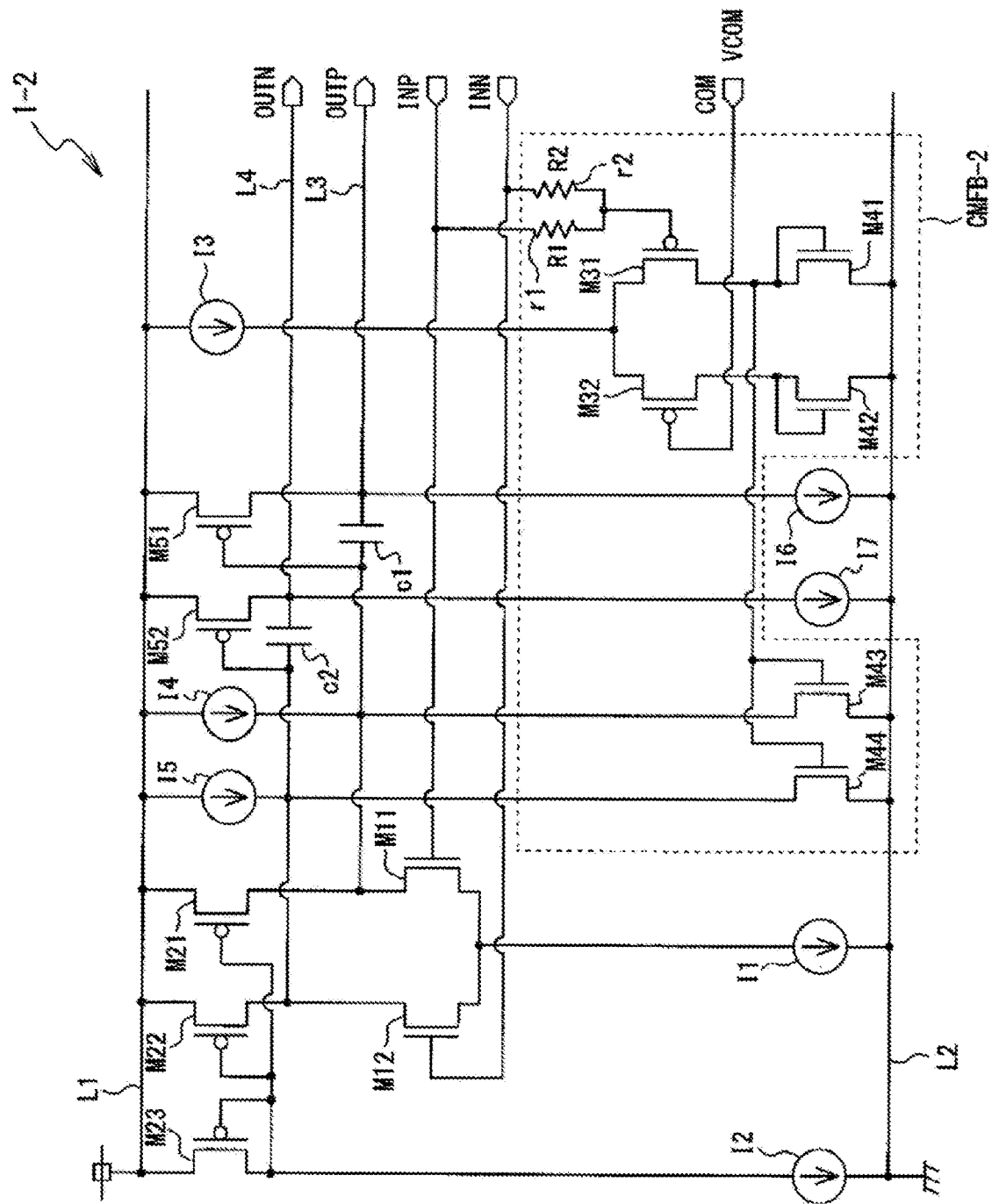
FIG. 5 is a circuit diagram illustrating an example of a fully differential operational amplifier according to a third embodiment of the disclosure.

FIG. 5 is a circuit diagram illustrating an example of a fully differential operational amplifier 1-2 according to a third embodiment. Note that the same reference signs will be applied to the same components as those in the fully differential operational amplifier 1 according to the first embodiment illustrated in FIG. 3, and detailed description thereof will be omitted.

The fully differential operational amplifier 1-2 according to the third embodiment is a two-stage fully differential operational amplifier in which the first stage is configured of a folded cascode while the fully differential operational amplifier 1 according to the first embodiment is a single-stage fully differential operational amplifier.

Specifically, similarly to the fully differential operational amplifier 1 illustrated in FIG. 3, the fully differential operational amplifier 1-2 includes: transistors M11 and M12 that form a differential pair that determines operating points of an output terminal OUTN and an output terminal OUTP; a constant current source I1 connected between sources of the transistors M11 and M12 and a power source line L2; transistors M21 and M22 connected between each of drains of the transistors M11 and M12 and a power source line L1; a transistor M23 connected between the power source lines L1 and L2; and a constant current source I2 connected between the transistor M23 and the power source line L2, the transistor M23 being diode-connected, a drain of the transistor M23 being connected to the transistors M21 and M22.

The fully differential operational amplifier 1-2 further includes: transistors M51 (first transistor) and M52 (second transistor) that are connected between the power source lines L1 and L2 and are configured of P-channel MOS transistors forming a folded cascode; a current source (third current source) I6 connected between the transistor M51 and the power source line L2; and a current source (fourth current source) I7 connected between the transistor M52 and the power source line L2. A drain of the transistor M51 is connected to the current source I6 and is also connected to a connection line L3 between the drain of the transistor M11 and the output terminal OUTP. In other words, one end of the current source I6 is connected to a node between one end of the transistor M51 and the output terminal OUTP. A capacitance c1 is connected between the node of the connection line L3, to which the drain of the transistor M51 is connected, and the node to which the gate is connected. A drain of the transistor M52 is connected to the current source I7 and is connected to a connection line L4 between the drain of the transistor M12 and the output terminal OUTN. In other words, one end of the current source I7 is connected to a node between one end of the transistor M52 and the output terminal OUTN. A capacitance c2 is connected between the node of the connection line L4, to which the drain of the transistor M51 is connected, and the node to which the gate is connected.

Similarly to the common mode feedback circuit CMFB illustrated in FIG. 3, a common mode feedback circuit CMFB-2 includes: transistors M31 and M32 that have sources connected to the power source line L1 via the constant current source I3 and configure a differential pair; transistors M41 and M42, each of which is connected between each of the transistors M31 and M32 and the power source line L2, and resistors r1 and r2, each of which has one end connected to the gate of the transistor M31 and the other end connected to each of the input terminal INP and the input terminal INN. The common mode feedback circuit CMFB-2 further has transistors M43 and M44 that are configured of N-channel MOS transistors, and gates of the transistors M43 and M44 are connected to the drains of the transistors M31 and M41. A drain of the transistor M43 is connected to the power source line L1 via the current source I4 and is also connected to the capacitor c1 and the drain of the transistor M11. A drain of the transistor M44 is connected to the power source line L1 via the current source I5 and is also connected to the capacitor c2 and the drain of the transistor M12.

Here, the first current generation circuit is configured of the transistor M43 and the current source I4, and the second current generation circuit is configured of the transistor M44 and the current source I5. Also, an output terminal of the first current generation circuit is connected to a gate, which is a control terminal, of the transistor M51, and an output terminal of the second current generation circuit is connected to a gate, which is a control terminal, of the transistor M52. Moreover, the control terminal of the transistor M51 is connected to the drains of the transistors M11 and M21, and the control terminal of the transistor M52 is connected to the drains of the transistors M12 and M22.

In the fully differential operational amplifier 1-2 illustrated in FIG. 5, the transistors M31 (third transistor) and M32 (fourth transistor), the transistors M41 (fifth transistor) and M42 (sixth transistor), the transistors M43 and M44, and the resistors r1 and r2 configure the common mode feedback circuit CMFB-2.

Also, the intermediate voltage generation circuit is configured of the resistor r1 and the resistor r2 and generates an intermediate voltage. The intermediate voltage is provided to the control terminal of the transistor M31, and the reference voltage VCOM is provided to the control terminal of the transistor M32. A common node of the other end of the transistor M31 and one end of the transistor M41 is connected to the first current generation circuit and the second current generation circuit. In other words, the common node is connected to the control terminal of the transistor M43 of the first current generation circuit and to the control terminal of the transistor M44 of the second current generation circuit.

In the fully differential operational amplifier 1-2 illustrated in FIG. 5, the common mode feedback circuit CMFB-2 controls internal nodes of the fully differential operational amplifier 1-2 such that the intermediate voltage of differential inputs provided to the input terminals INP and INN becomes equal to the reference voltage VCOM provided to the input terminal COM, similarly to the common mode feedback circuit CMFB illustrated in FIG. 3. Therefore, it is possible to obtain advantages equivalent to those of the fully differential operational amplifier 1 according to the first embodiment in this case as well. In other words, it is possible to ascertain that the common mode feedback circuit CMFB that adjusts the output differential signals in accordance with input differential signals can be applied without depending on the number of stages and the configuration of each stage that the fully differential operational amplifier 1 includes.

Fourth Embodiment

Next, a fourth embodiment of the disclosure will be described.

Configuration Example of Fully Differential Operational Amplifier 1-3

Figure 6:
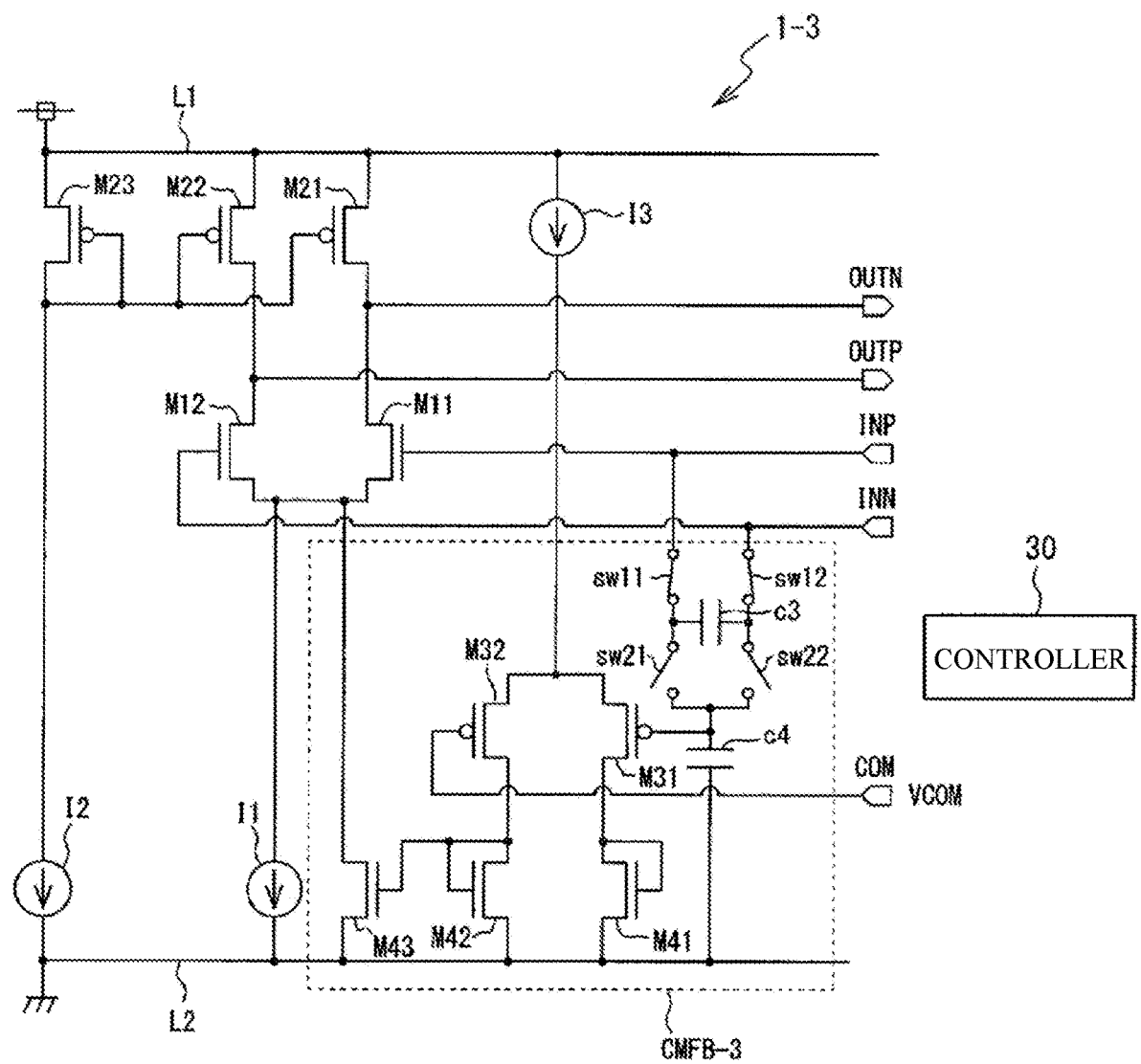
FIG. 6 is a circuit diagram illustrating an example when a fully differential operational amplifier is in a differential input signal sampling phase, according to a fourth embodiment of the disclosure.
Figure 7:
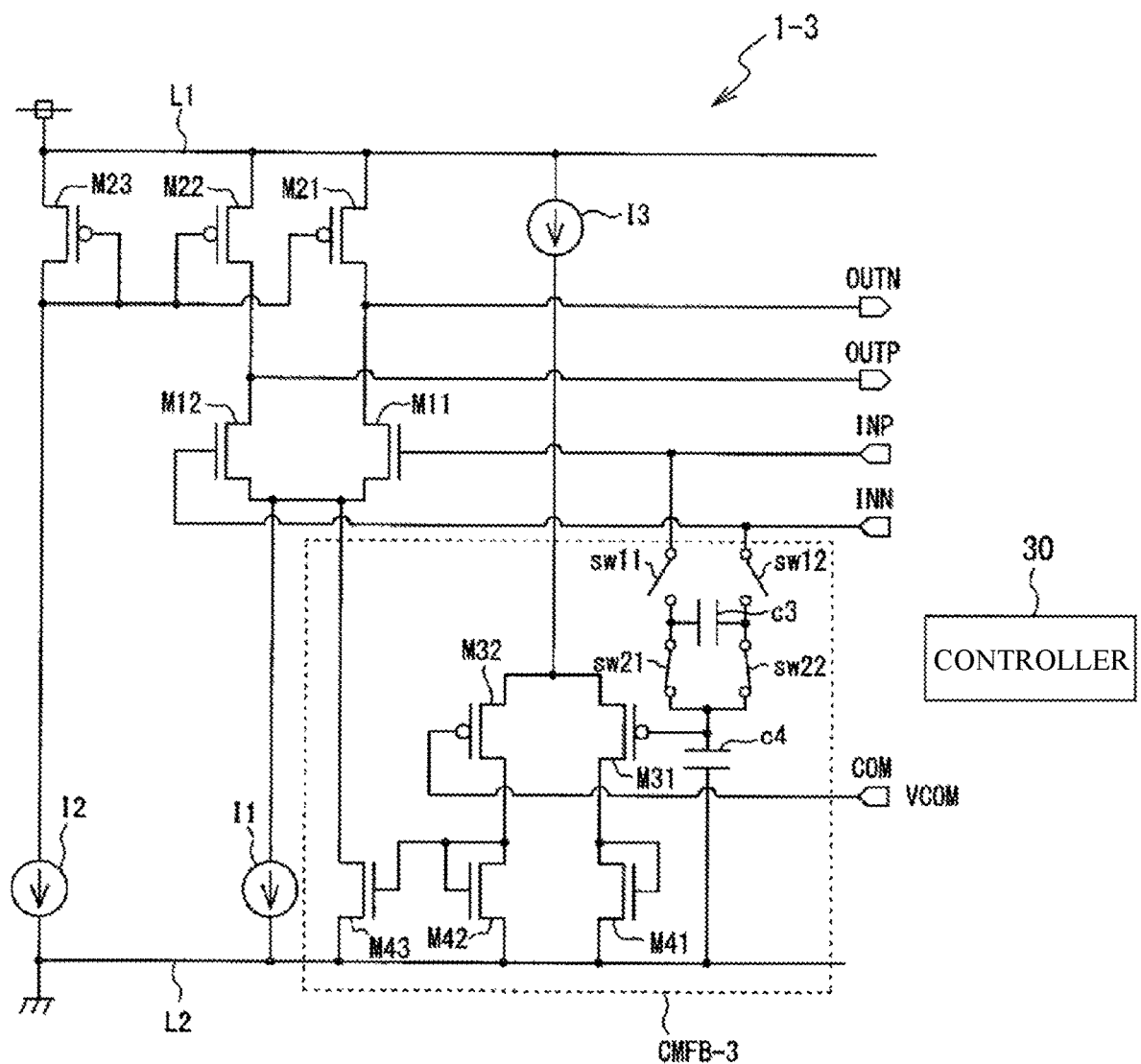
FIG. 7 is a circuit diagram illustrating an example when a fully differential operational amplifier is in an average voltage transferring phase, according to the fourth embodiment of the disclosure.

FIGS. 6 and 7 are circuit diagrams illustrating an example of a fully differential operational amplifier 1-3 according to the fourth embodiment. Note that the same reference signs will be applied to the same components as those of the fully differential operational amplifier 1 according to the first embodiment illustrated in FIG. 3, and detailed description thereof will be omitted.

The fully differential operational amplifier 1-3 according to the fourth embodiment is provided with switches sw11 (first switch), sw12 (second switch), sw21 (third switch), and sw22 (fourth switch), and capacitances c3 (first capacitive element) and c4 (second capacitive element) instead of the resistors r1 and r2 in the common mode feedback circuit CMFB in the fully differential operational amplifier 1 according to the first embodiment, and an intermediate voltage of signals differentially provided to input terminals INP and INN is provided to a gate of a transistor M31 using these elements (intermediate voltage generation circuit).

Specifically, the switches sw11 and sw21 connected in series are connected between the input terminal INP and the gate of the transistor M31, and similarly, the switches sw12 and sw22 connected in series are connected between the input terminal INN and the gate of the transistor M31.

The capacitor c3 is connected between a connection point of the switch sw11 and the switch sw21 and a connection point of the switch sw12 and the switch sw22, and a connection point between the switches sw21 and sw22 and the gate of the transistor M31 is connected to a power source line L2 via the capacitor c4.

As illustrated in FIG. 6, when both the switches sw11 and sw12 are in an ON state (conductive state), and both the switches sw21 and sw22 are in an OFF state (disconnected state), the signals provided to the input terminals INP and INN are sampled at both ends of the capacitor c3. Hereinafter, this phase will be referred to as a differential input signal sampling phase.

Thereafter, control is performed such that both the switches sw11 and sw12 are brought into an OFF state and both the switches sw21 and sw22 are brought into an ON state as illustrated in FIG. 7. In this manner, voltages of the signals sampled at both ends of the capacitor c3 and provided to the input terminals INP and INN are averaged by making both the switches sw21 and sw22 into the ON state. In other words, a voltage that is equal to the intermediate voltage of the differentials of the signals provided to the input terminals INP and INN is generated by the capacitor c3, and further, the generated voltage is transferred to the gate of the transistor M31 and is then provided as a gate voltage to the gate of the transistor M31. Hereinafter, this phase will be referred to as an average voltage transfer phase. The capacitor c4 smooths and holds the voltage transferred to the gate of the transistor M31. The four switches sw11 to sw22 are controlled by a controller 30.

A voltage that is equal to the intermediate voltage of the signals differentially provided to the input terminals INP and INN is provided to the gate of the transistor M31 that is a differential pair of the common mode feedback circuit CMFB-3 through repetition of the aforementioned differential input signal sampling phase (FIG. 6) and the average voltage transfer phase (FIG. 7). Therefore, it is possible to obtain advantages equivalent to those of the fully differential operational amplifier 1 according to the first embodiment in this case as well. In other words, the input unit that generates the intermediate voltage of the differential inputs provided to the differential input terminals INP and INN of the fully differential operational amplifier 1 and provides the intermediate voltage to the transistor M31 that is a differential pair of the common mode feedback circuit CMFB is not limited to the configuration using the resistors r1 and r2 illustrated in FIG. 3.

Fifth Embodiment

Next, a fifth embodiment of the disclosure will be described.

In the fifth embodiment, a current-voltage conversion circuit IVC that converts a differential output current of a switched register-type digital-to-analog converter (DAC) into a voltage value is configured using the fully differential operational amplifier 1 according to the disclosure as a circuit configuration example using the fully differential operational amplifier 1. An example of the current-voltage conversion circuit IVC using the fully differential operational amplifier 1 is illustrated in FIG. 8.

Figure 8:
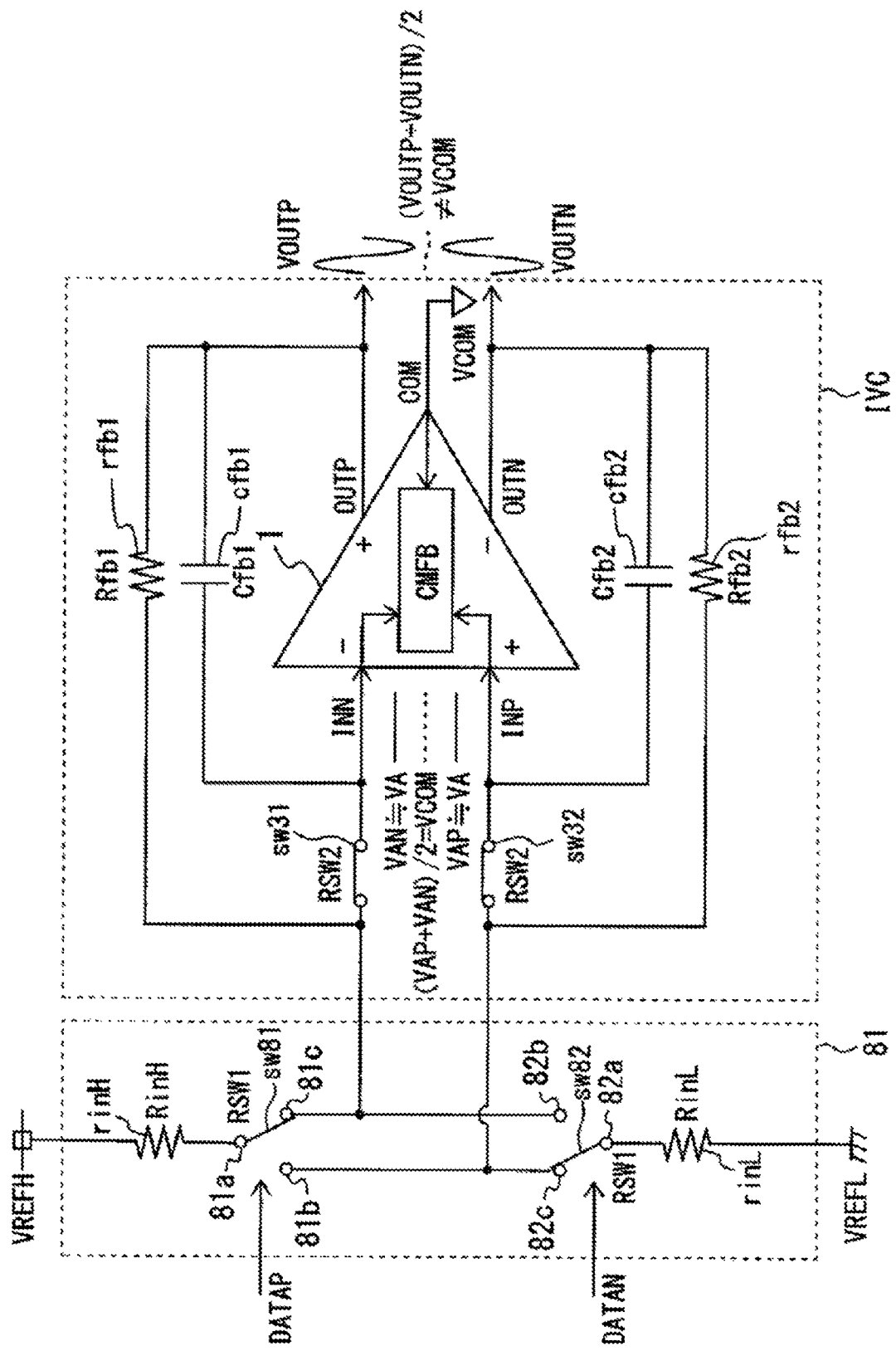
FIG. 8 is a circuit diagram illustrating an example of a current-voltage conversion circuit using a fully differential operational amplifier according to an embodiment of the disclosure.
Figure 9:
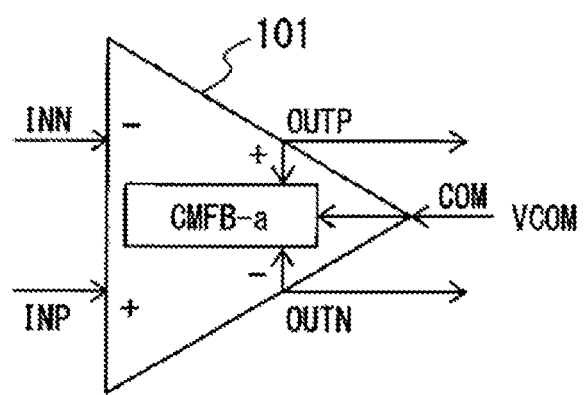
FIG. 9 is a schematic view illustrating an example of a fully differential operational amplifier in the related art.
Figure 10:
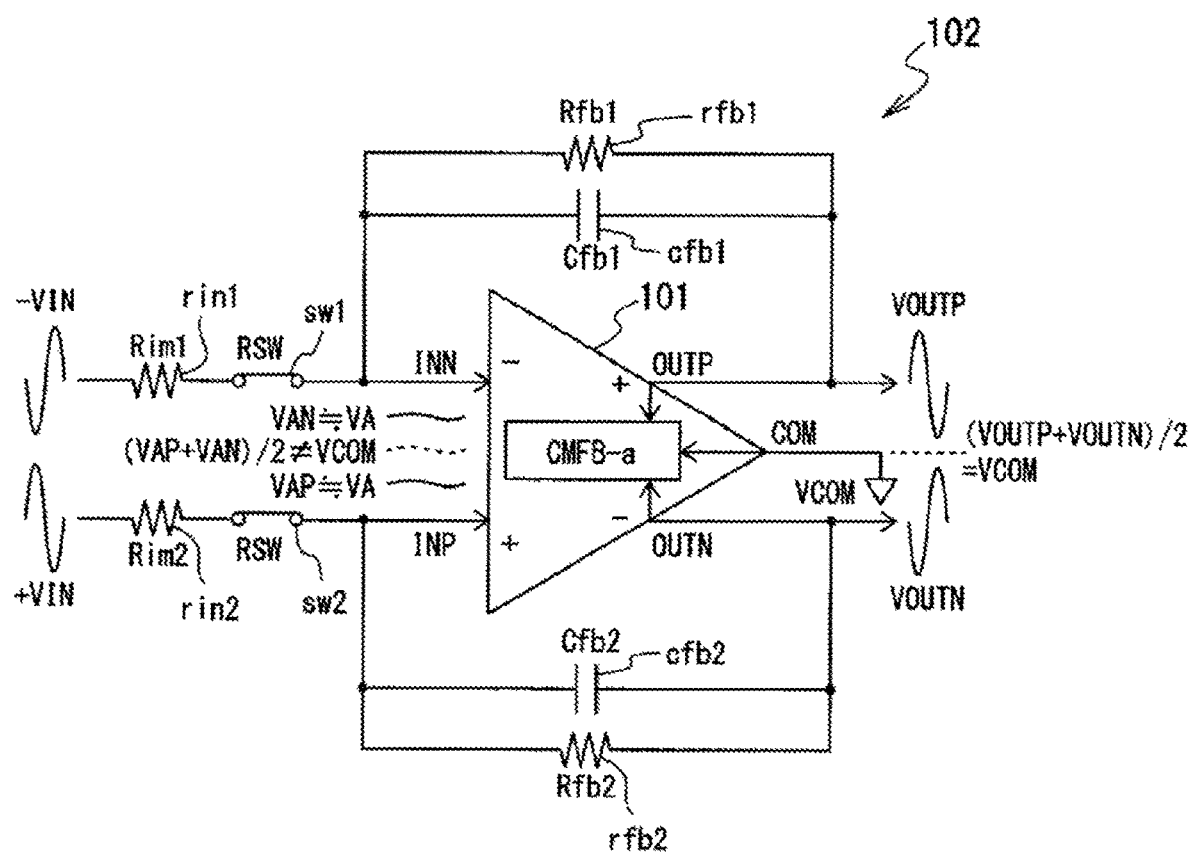
FIG. 10 is a circuit diagram illustrating an example of a fully differential inverting circuit provided with a mute function using the fully differential operational amplifier in the related art.
Figure 11:
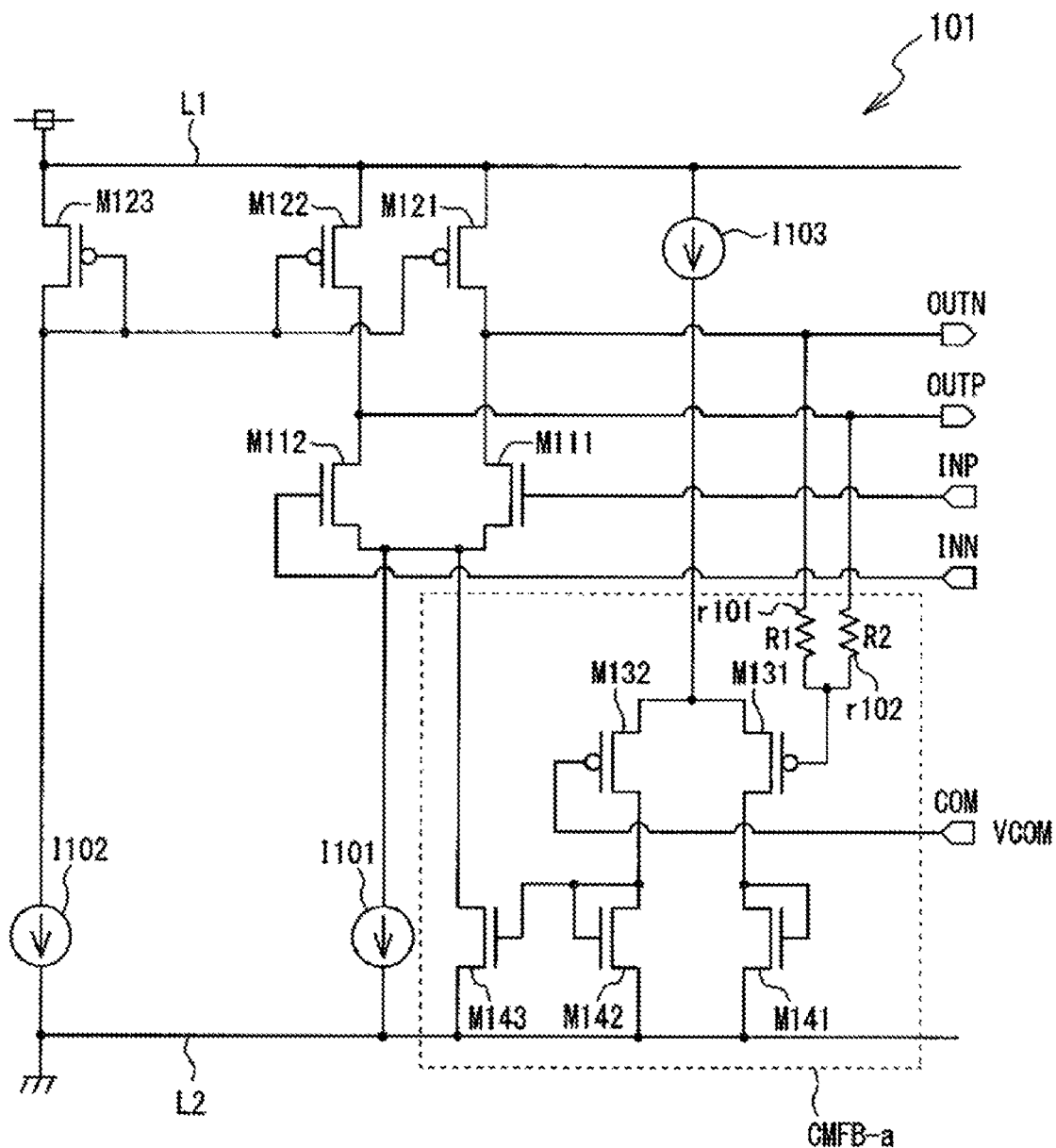
FIG. 11 is a circuit diagram illustrating an example of the fully differential operational amplifier in the related art.

As illustrated in FIG. 8, the current-voltage conversion circuit IVC includes: the fully differential operational amplifier 1; a switch sw31 connected to one input terminal INN to which a differential signal of the fully differential operational amplifier 1 is provided; a switch sw32 connected to the other input terminal INP; a feedback capacitor cfb1 connected between one end of the switch sw31 on the side of the input terminal INN and an output terminal OUTP; a feedback resistor rfb1 connected between the other end of the switch sw31 and the output terminal OUTP; a feedback capacitor capacitance cfb2 connected between one end of the switch sw32 on the side of the input terminal INP and the other output terminal OUTN; and a feedback resistor rfb2 connected between the other end of the switch sw32 and the output terminal OUTN. The feedback resistor rfb1 and the feedback capacitor cfb1 correspond to a first circuit, and the feedback resistor rfb2 and the feedback capacitor cfb2 correspond to a second circuit.

A common mode feedback circuit CMFB included in the fully differential operational amplifier 1 performs control such that an intermediate voltage of differential outputs output from the output terminals OUTP and OUTN is consistent with a reference voltage VCOM based on differential voltages of input signals provided to the input terminals INN and INP and the reference voltage VCOM provided to the input terminal COM.

A switched register DAC 81 includes a resistor rinH connected between a switch sw81 and a reference voltage VREFH on the side of a high potential and a resistor rinL connected between a switch sw82 and a reference voltage VREFL on a side of a low potential that is a ground potential. The switches sw81 and sw82 are single-pole double-through switches and include a movable contact a and fixed contacts b and c. The switch sw81 includes a movable contact 81a and fixed contacts 81b and 81c. The switch sw82 includes a movable contact 82a and fixed contacts 82b and 82c.

The movable contact 81a of the switch sw81 and one end of the resistor rinH are connected, the fixed contact 81b and the fixed contact 82c of the switch sw82 are connected, and the fixed contact 81c and the fixed contact 82b are connected. The movable contact 82a of the switch sw82 is connected to the resistor rinL.

Then, a part between the fixed contact 81c and the fixed contact 82b and one end of the switch sw31 of the current-voltage conversion circuit IVC are connected, and similarly, a part between the fixed contact 81b and the fixed contact 82c and one end of the switch sw32 of the current-voltage conversion circuit IVC are connected. The switches sw81 and sw82 are controlled using digital signals DATAP and DATAN output from circuits in previous stages, which are not illustrated. Also, the switches sw31 and sw32 are controlled by a control device, which is not illustrated.

As illustrated in FIG. 8, the switches sw81 and sw82 of the switched register DAC 81 are controlled using the digital signals DATAP and DATAN, and two currents output from the switched register DAC 81 pass through the two switches sw81 and sw82 of the switched register DAC 81. Both resistance values (that is, an ON resistance) of the switches sw81 and sw82 in an ON state are RSW1.

In FIG. 8, two currents output from the switched register DAC 81 are ideal output currents based on the digital signals DATAP and DATAN when both the ON resistances of the switches sw81 and sw82 are RSW1 and are a constant value.

Also, the current-voltage conversion circuit IVC ideally performs current-voltage conversion when both the ON resistance values of the two switches sw31 and sw32 connected to the input terminals INN and INP of differential signals of the fully differential operational amplifier 1 are RSW2 and are a constant value. Therefore, since the control is performed such that the ON resistance values of the switches sw31 and sw32 are consistent with to the reference voltage VCOM by configuring the current-voltage conversion circuit IVC using the fully differential operational amplifier 1, it is possible to suppress harmonic distortion generated in fully differential output signals output from the current-voltage conversion circuit IVC.

Note that although the case in which the fully differential operational amplifier 1 illustrated in FIG. 3 is applied as the fully differential operational amplifier has been described hitherto, the fully differential operational amplifier is not limited to the fully differential operational amplifier 1 illustrated in FIG. 3, and it is also possible to apply the fully differential operational amplifiers 1-1 to 1-4 and to obtain equivalent advantages.

Although the embodiments of the disclosure have been described above, the aforementioned embodiments are for exemplifying apparatuses and methods for specifically implementing the technical ideas of the disclosure, and the technical ideas of the disclosure are not intended to limit materials, shapes, structures, disposition, and the like of the components. Various modifications can be added to the technical ideas of the disclosure within the technical scope defined by the claims.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A differential amplifier comprising:
   an inverting input terminal;
   a non-inverting input terminal;
   an inverting output terminal;
   a non-inverting output terminal;
   an input differential pair that determines operating points of the inverting output terminal and the non-inverting output terminal;
   a common mode detection circuit, to which a reference signal is received, which generates a signal based on a differential between the reference voltage and an intermediate voltage of a voltage provided to the inverting input terminal and a voltage provided to the non-inverting input terminal;
   a first current generation circuit and a second current generation circuit, to which an output signal of the common mode detection circuit is provided, which generate currents in accordance with the output signal;
   a first transistor having a control terminal coupled to an output terminal of the first current generation circuit;
   a second transistor having a control terminal coupled to an output terminal of the second current generation circuit;
   a third current source having one end coupled to a node between one end of the first transistor and the non-inverting output terminal;
   a fourth current source having one end coupled to a node between one end of the second transistor and the inverting output terminal;
   a first circuit coupled between the inverting input terminal and the non-inverting output terminal; and
   a second circuit coupled between the non-inverting input terminal and the inverting output terminal.

2. The differential amplifier according to claim 1,
   wherein the common mode detection circuit comprising:
   an intermediate voltage generation circuit that generates the intermediate voltage;
   a third transistor having a control terminal to which the intermediate voltage is provided;
   a fourth transistor having a control terminal to which the reference voltage is provided;
   a second constant current source, coupled to a node to which one end of the third transistor and one end of the fourth transistor are coupled;
   a fifth transistor coupled between the other end of the third transistor and a first power source; and
   a sixth transistor coupled between the other end of the fourth transistor and the first power source,
   wherein the other end of the third transistor and one end of the fifth transistor are coupled to the first current generation circuit and the second current generation circuit.

3. The differential amplifier according to claim 2, further comprising:
   a controller that generates a control signal for controlling the intermediate voltage generation circuit,
   wherein the intermediate voltage generation circuit comprises:
   a first switch and a second switch that are connected in series between the inverting input terminal and the control terminal of the first transistor,
   a third switch and a fourth switch that are connected in series between the non-inverting input terminal and the control terminal of the first transistor,
   a first capacitive element connected between a common node of the first switch and the second switch and a common node of the third switch and the fourth switch, and
   a second capacitive element connected between the control terminal of the first transistor and the first power source, and
   the controller generates the control signal for complementarily making the first switch and the third switch, and the second switch and the fourth switch into an ON state.

4. The differential amplifier according to claim 1,
   wherein the first circuit is configured of a parallel connection of a first resistive element and a first capacitive element, and the second circuit is configured of a parallel connection of a second resistive element and a second capacitive element.

\* \* \* \* \*